(12) United States Patent
Chauhan et al.

(10) Patent No.: US 12,738,940 B1
(45) Date of Patent: Sep. 15, 2026

(54) INPUT/OUTPUT (IO) FAILSAFE PROTECTION TOPOLOGY IN LEAKY TECHNOLOGY NODES

(71) Applicant: Synopsys, Inc., Sunnyvale, CA (US)

(72) Inventors: Shailesh Kumar Chauhan, Uttar Pradesh (IN); Akhil Thotli, Karnataka (IN); Kailash Kumar, Uttar Pradesh (IN); Ankit Agrawal, Uttar Pradesh (IN)

(73) Assignee: Synopsys, Inc., Sunnyvale, CA (US)

( * ) Notice: Subject to any disclaimer, the term of this patent is extended or adjusted under 35 U.S.C. 154(b) by 165 days.

(21) Appl. No.: 18/909,692

(22) Filed: Oct. 8, 2024

(51) Int. Cl.
*H03K 19/007* (2006.01)
*G06F 11/07* (2006.01)
*H03K 19/003* (2006.01)

(52) U.S. Cl.
CPC ....... *H03K 19/007* (2013.01); *G06F 11/0796* (2013.01); *H03K 19/00315* (2013.01)

(58) Field of Classification Search
None
See application file for complete search history.

(56) References Cited

U.S. PATENT DOCUMENTS 6,501,318 B1 12/2002 Randazzo et al.
7,839,174 B2 * 11/2010 Wang ............ H03K 19/018521 326/26
2006/0091907 A1 5/2006 Khan
2021/0208615 A1 * 7/2021 Bogi ...................... G05F 1/571
2021/0249855 A1 8/2021 Whitney et al.
2021/0279197 A1 9/2021 Hamlyn et al.
2024/0072803 A1 * 2/2024 Kumar ............ H03K 19/00384

* cited by examiner

*Primary Examiner* — Anh Q Tran
(74) *Attorney, Agent, or Firm* — Andrew L. Dunlap; Haynes Beffel & Wolfeld LLP

(57) ABSTRACT

Failsafe IO circuitry is provided that can operate in a failsafe mode and a normal mode. The failsafe IO circuitry can include input circuitry that (i) receives a pad signal (PAD) from driver circuitry, (ii) receives control signals (VDDIO, VREFN) and (iii) provides an output signal (PADBY2) generated based on the received control signals (VDDIO, VREFN), wherein, when operating in a normal mode, the pad signal (PAD) is a floating signal and the output signal (PADBY2) is 0 volts (0V), and power gated logic circuitry that (i) receives the output signal (PADBY2) from the input circuitry, (ii) receives the control signals (VDDIO, VREFN) and (iii) outputs a reference pad failsafe signal (PAD_FS), wherein, when operating in the normal mode, the reference pad failsafe signal (PAD_FS) is 0V.

20 Claims, 11 Drawing Sheets

100
102
104
106
108
110
112
PAD
Isink
Isource
Isink > Isource
PADBY2
VDD
PM
PS
PP
NP
NS
NM
PD
SIG1
SIG2
VREFN
VREFP
ND
PADFS

| Signals | PAD = floating case, when VDDIO (supply) is available with circuitry of FIG. 2 | PAD = floating case, when VDDIO (supply) is available with circuitry of FIG. 6 | Failsafe case, when VDDIO (supply) is NOT available with circuitry of FIG. 6 |
|---|---|---|---|
| VREFN | 0.5*VDDIO | 0.5*VDDIO | 0V |
| VREFP | 0.5*VDDIO | 0.5*VDDIO | 0V |
| PADBY2 | floating | 0V | 0.5*PAD |
| NC_FS | - | VREFN | 0.5*PAD |
| NC | - | VDDIO | 0.5*PAD |
| NETP | floating | VREFP | 0.5*PAD |
| NETN | floating | VREFN | 0.5*PAD |
| PAD_FS | floating | 0V | PAD |
| VDDIO_DET | floating | VDDIO | 0V |
| VREFN_DET | floating | VREFN | 0V |
| PG_FS_S | floating | VREFP | 0.5*PAD |
| PG_FS_P | floating | VREFP | PAD |
| VREFN_FS | floating | VREFN | 0.5*PAD |

FIG. 7

INPUT/OUTPUT (IO) FAILSAFE PROTECTION TOPOLOGY IN LEAKY TECHNOLOGY NODES

TECHNICAL FIELD

The present disclosure relates to integrated circuits (ICs) and more particularly to failsafe input/output (IO) circuits that provide signals to failsafe circuits.

BACKGROUND

A failsafe input/output (IO) circuit can be used to provide inputs to a failsafe circuit. Failsafe circuits have numerous applications. For example, one application of a failsafe circuit is for reducing power consumption in electronic devices by putting an electrical device or electrical components thereof into a standby or power saving mode. The failsafe circuit of the electrical device can receive inputs from a failsafe input/output circuit that essentially controls the failsafe circuit. The inputs from the failsafe IO circuit provide signals to the failsafe circuit to place the failsafe circuit and the electronic device into a desired mode (e.g. a power saving mode).

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 7 is a chart that illustrates values of various signals using the circuitry of FIG. 2 and FIG. 6.

DETAILED DESCRIPTION

Figure 1:
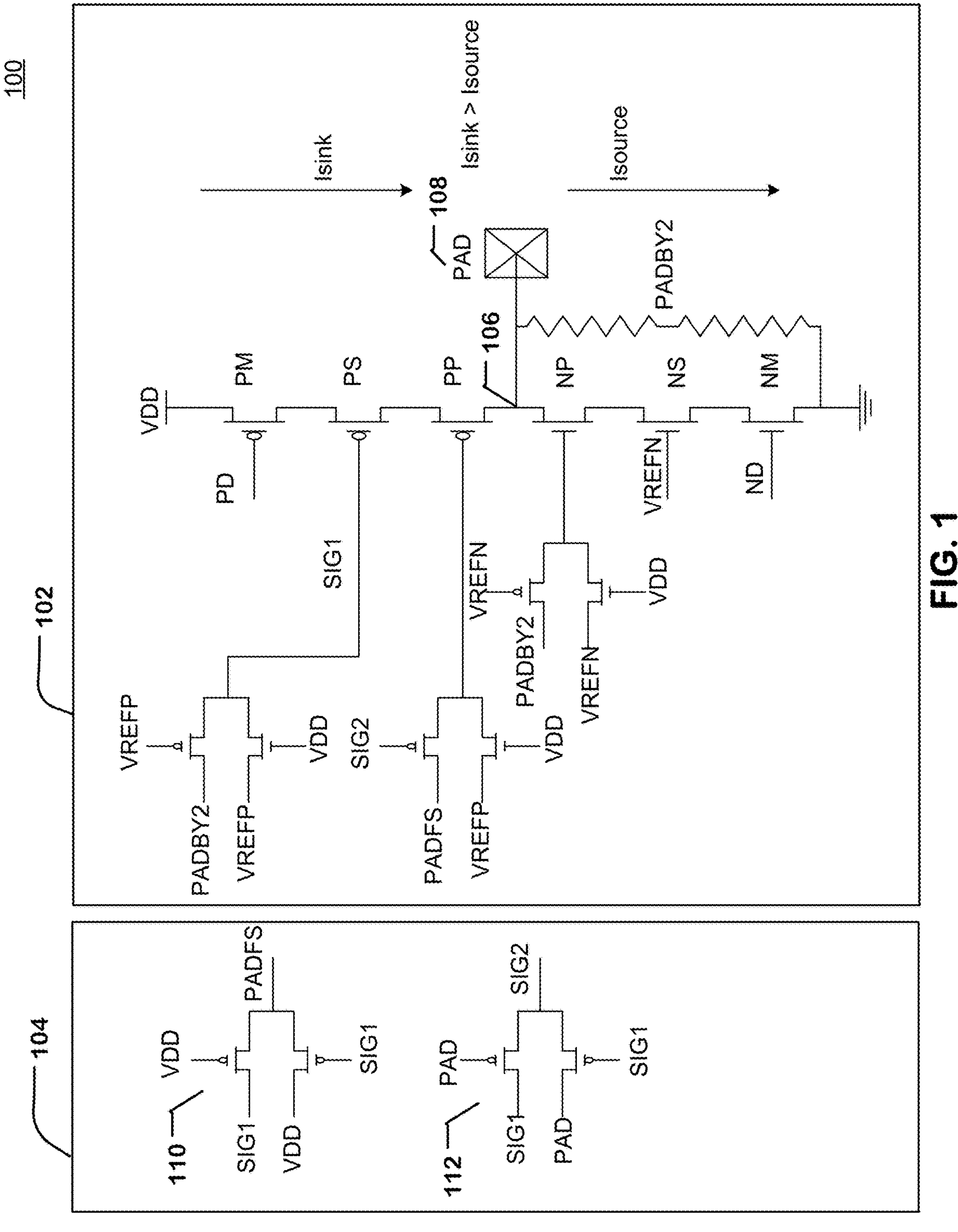
FIG. 1 illustrates failsafe input/output (IO) circuitry that includes a driver that generates one or more signals for a failsafe circuit and that includes circuitry that generates one or more signals for the driver.

Aspects of the present disclosure relate to input/output (IO) failsafe protection topology in leaky technology nodes. Failsafe IO circuitry can be used to provide signals (e.g., failsafe signals) to failsafe circuitry. The signals provided by the failsafe IO circuitry are typically generated in response to many (control, etc.) signals, including a pad signal (received form a PAD). Failsafe circuitry can be used for many applications, one of which being reducing power consumption. For example, a failsafe circuit can be used to put other electrical components into a standby mode or, in other words, provide protection to other circuits so that they do not receive signals (or signals that are too high or that are too low) when they are not supposed to be receiving electrical signals or when they are only supposed to receive electrical signals within a certain range.

The pad signal received from a PAD of a failsafe IO circuit can provide, for example, three outputs, a logic high output, a logic low output and an "open" output, which is a high impedance output. This can be referred to as a tri-state circuit (or PAD). The three states being "high," "low" and "HiZ" (meaning "open" or high impedance). Failsafe IO circuitry and failsafe circuitry can operation in two modes, including a failsafe mode (i.e., the failsafe IO circuitry is operating in a failsafe mode) and a normal mode (e.g., a non-failsafe mode) (i.e., the failsafe IO circuitry is operating in a normal mode). When in the failsafe mode, the failsafe IO circuitry provides logic "high" and "low" signals on the PAD and when in the normal (non-failsafe) mode the failsafe IO circuitry should be "open" ("HiZ", also referred to as a floating PAD that provides a floating signal).

Some failsafe IO circuits can, when in the "HiZ" state, still receive current that leaks into the PAD from another component (e.g., Isink current). When the Isink current is higher than the Isource current, the PAD will no longer be in the "HiZ" (floating) state. As a result, current leaks from the PAD to the failsafe circuitry, even though the PAD of the failsafe IO circuit is not supposed to be providing any current to the failsafe circuitry. In the normal mode the PAD can be referred to as a floating PAD (e.g., a floating signal), which is subject to the Isink current. This current leakage to and from the floating PAD is undesirable, as it can cause the failsafe circuitry to operate in an undesirable manner and can also cause undue stress on the components of the failsafe IO circuitry.

As technology components are shrinking it can become more difficult to prevent leakage current. Currently, technology components, such as transistors, with thick gates are less desirable because they occupy more space. Therefore, transistors identified as "thin gate devices" are preferred, because they are smaller. These "thin gate devices" can also be referred as "high technology nodes" or "higher technology nodes". These "thick gate devices" can also be referred to as "low technology nodes" or "lower technology nodes". The "thin gate devices" can leak current with a multi-fold increase in comparison to current leakage of "thick gate devices." As a result, these lower technology nodes with thinner gates have greater current leakage. As a result, when a PAD of a failsafe IO circuit is in the HiZ state, it can actually leak current making it look like the PAD (or the failsafe IO circuitry) is in a low (low current) state, causing the electrical components connected to the failsafe IO circuit to behave in an undesirable way. This can create undesired net voltages at few intermediate nets (circuits), and can lead to electrical over-stress issues and reliability concerns. The failsafe IO circuitry illustrated and discussed with reference to FIGS. 1-5 is subject to this current leakage and over-stress issues of the components therein. The failsafe IO circuitry discussed with reference to FIG. 6 solves the problems that are present in the failsafe IO circuitry discussed with reference to FIG. 5.

Therefore a need arises for a failsafe IO circuit with higher technology nodes (thin gate devices) and that does not leak current and put other circuits in an undesirable state.

FIG. 1 illustrates failsafe input/output (IO) circuitry 100 that includes driver circuitry 102 that generates one or more signals for a failsafe circuit and that includes signal generation circuitry 104 that generates one or more signals for the driver circuitry 102.

As illustrated, the driver circuitry 102 includes a string of p-type metal oxide semiconductor (PMOS) and n-type metal oxide semiconductor (NMOS) transistors in series. Specifically, the string of transistors includes PMOS transistor (PM), PMOS transistor (PS) and PMOS transistor (PP). The source of PMOS transistor (PM) is connected to VDD and the drain of PMOS transistor (PP) is connected a node 106 that is connected to the PAD 108 that provides the pad signal to the failsafe circuitry (not illustrated). The string of transistors also includes NMOS transistor (NP), NMOS transistor (NS) and NMOS transistor (NM). The drain of NMOS transistor (NP) is connected to the node 106 that is connected to the PAD 108. The source of NMOS transistor (NM) is connected to ground. Signal (PADBY2) can be generated across two resistors that are parallel to the NMOS transistors (NNP, NS, NM).

PMOS transistor (PM) can receive an input PMOS driver signal (PD), PMOS transistor (PS) can receive signal (SIG1), PMOS transistor (PP) can receive either signal (PADFS) or signal (VREFP) depending on the values of signal (SIG2) and signal (VDD), NMOS transistor (NP) can receive either signal (PADBY2) or signal (VREFN) depending on the values of signal (VREFN) and signal (VDD), NMOS transistor (NS) can receive signal (VREFN) and NMOS transistor (NM) can receive an input NMOS driver signal (ND).

The signal generation circuitry 104 uses circuitry 110 that includes two PMOS transistors that receive signals (SIG1, VDD) and that are controlled by signals (VDD, SIG1) at their gates to provide signal (PADFS), being one of signal (SIG1) and signal (VDD). Similarly, signal generation circuitry 104 uses circuitry 112 that includes two PMOS transistors that receive signals (SIG1, PAD) and that are controlled by signals (PAD, SIG1) at their gates to provide signal (SIG2).

As previously discussed, when the failsafe IO circuitry is operating in the normal (non-failsafe) mode, current (Isink) can leak into the PAD 108 and current (Isource) can be drawn from the PAD 108 while the PAD 108 is in a floating state. When Isink is greater than Isource, the voltage provided form the PAD 108 can increase to an undesirable amount. This can cause undesirable behavior in the failsafe circuitry. This can occur as a result of the size of technology shrinking (e.g., in "higher technology nodes"), while restricting the usage of thick gate devices, which result in the thin gate devices bearing a multi-fold increase in leakages, which in turn restricts the PAD 108, which should be in a "HiZ" state from remaining at 0V or at a low value. This intermediate voltage at the PAD 108 can cause the failsafe circuit to malfunction and not operate as desired, creating undesired net voltages at intermediate nets, and can lead to electrical over-stress issues and reliability concerns.

The components and signals illustrated in FIG. 1 are only examples, as other signals and configurations of components can be used to provide failsafe IO signals to failsafe circuitry as realized by a person of ordinary skill in the art.

Figure 2:
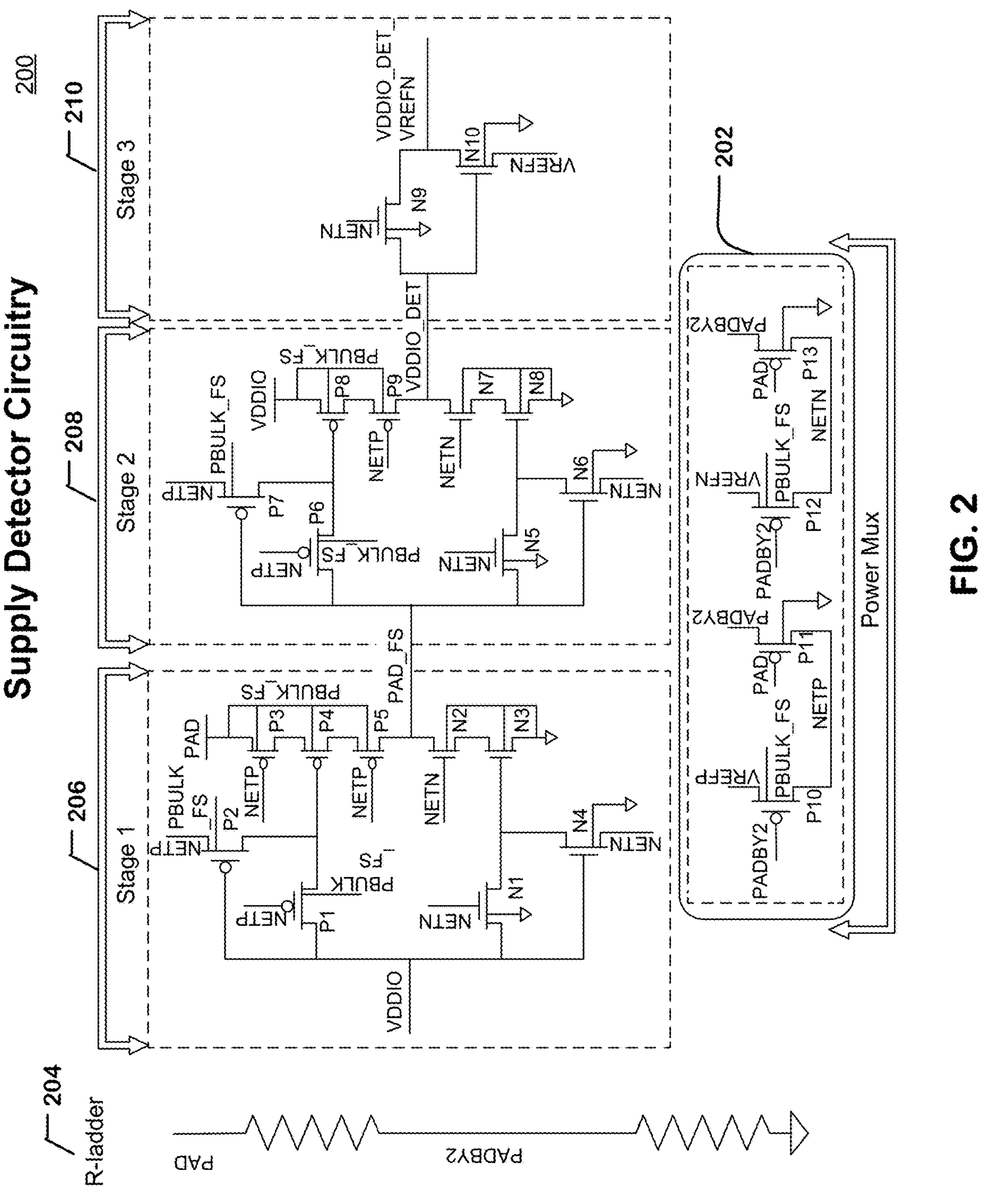
FIG. 2 illustrates failsafe IO circuitry that addresses some of the problems present in the failsafe IO circuitry of FIG. 1 and that includes three stage supply detector circuitry and power mux circuitry.
Figure 4:
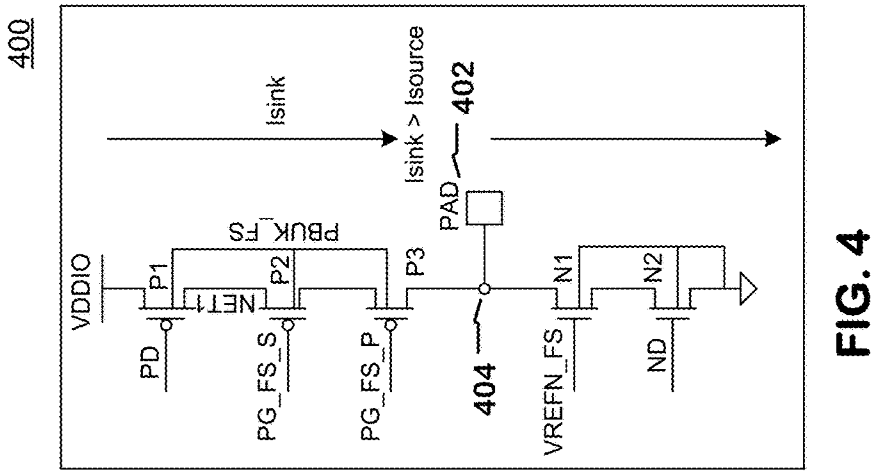
FIG. 4 illustrates driver circuitry that provides a pad signal (PAD) to the failsafe IO circuitry of FIG. 2.
Figure 3:
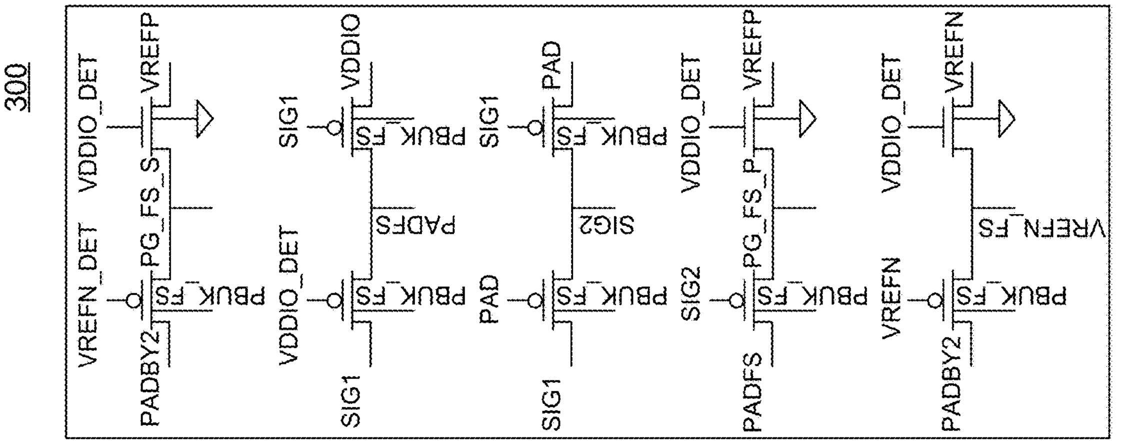
FIG. 3 illustrates signal generation circuitry that provides signals to the failsafe IO circuitry of FIG. 2.

FIGS. 2-4 illustrate failsafe IO circuitry that can solve some of the problems of the failsafe IO circuitry of FIG. 1, but where the failsafe IO circuitry of FIGS. 2-4 can still experience over-stress and reliability concerns, as described below.

Specifically, FIG. 2 illustrates failsafe IO circuitry that addresses some of the problems present in the failsafe IO circuitry 100 of FIG. 1 and that includes three stage supply detector circuitry 200 that also includes power mux circuitry 202.

As illustrated in FIG. 2, the supply detector circuitry 200 includes a resistor ladder (R-ladder) 204 that generates signal (PADBY2) from a pad signal (PAD) received from, for example, driver circuitry 400 of FIG. 4. The supply detector circuitry 200 includes stage 1 206 that generates signal (PAD_FS) from signals (VDDIO, PAD, NETP, NETN), stage 2 208 that generates (VDDIO detection) signal (VDDIO_DET) from signal (PAD_FS) generated from stage 1 206 and from signals (VDDIO, NETN, NETP) and stage 3 210 that receives signal (VDDIO_DET) from stage 2 208 and that generates signal (VDDIO_DET_VREFN) from signals (VDDIO_DET, NETN and VREFN). The power mux circuitry 202 generates signals (NETP, NETN) from signals (PADBY2, VREFP, PAD, VREFN). VDDIO, VREFN, VREFP, NETP, NETN, VDDIO_DET, VDDIO_DET_VREFN and PAD, as well as other signals described herein, can be referred to as control signals.

The components and signals illustrated in FIGS. 2-4 are only examples, as other signals and configurations of components can be used to provide failsafe IO signals to failsafe circuitry as realized by a person of ordinary skill in the art. Various operation states and signal values of the circuitry of FIGS. 2-4 are provided below for purposes of describing the potential problems with the circuitry of FIGS. 2-4, without completely describing the operation of each component of the circuitry of FIGS. 2-4.

Stage 1 206 includes a string of PMOS transistors (P3, P4, P5) connected to a string of NMOS transistors (N2, N3). The gate of PMOS transistor (P3) is controlled by signal (NETP), the gate of PMOS transistor (P4) is controlled by PMOS transistors (P1, P2) and the gate of PMOS transistor (P5) is controlled by signal (NETP). The gate of NMOS transistor (N2) is controlled by signal (NETN) and the gate of NMOS transistor (N3) is controlled by NMOS transistors (N1, N4). The string of PMOS and NMOS transistors (P3, P4, P5, N2, N3) is connected between the pad signal (PAD) and ground and provide signal (PAD_FS) to stage 2 208. The signal (PAD_FS) can be referred to as a reference pad failsafe signal (PAD_FS).

Stage 2 208 includes PMOS transistors (P6, P7, P8, P9) and NMOS transistors (N5, N6, N7, N8). Stage 2 208 operates using the received signal (PAD_FS) and signals (NETP, NETN) generated by power mux circuitry 202. Signal (NETP) is generated using PMOS transistors (P10, P11). PMOS transistor (P10) is controlled by signal (PADBY2) and receives signal (VREFP) and PMOS transistor (P11) is controlled by pad signal (PAD) and receives signal (PADBY2). Similarly, signal (NETN) is generated using PMOS transistors (P12, P13). PMOS transistor (P12) is controlled by signal (PADBY2) and receives signal (VREFN) and PMOS transistor (P13) is controlled by pad signal (PAD) and receives signal (PADBY2).

Stage 3 210 includes NMOS transistors (N9, N10) which are variously controlled by signals (VDDIO_DET, NETN)

and variously receive signals (VDDIO_DET, VREFN) to provide signal (VDDIO_DET_VREFN) to failsafe circuitry (not illustrated).

As discussed with reference to the driver circuitry 400 of FIG. 4, when the driver circuitry 400 is in a tri-state mode, such current leakage (Isink) to PAD 402 is more than the current leakage (Isource) from PAD 402 to ground. Therefore, PAD 402 will be floating and can take any voltage depending on leakage current (Isink) from the driver circuitry 400. This (intermediate) voltage at PAD 402 can malfunction the failsafe circuitry, creating undesired net voltages at few intermediate nets, and leads to electrical over-stress issues and reliability concerns.

Since floating PAD 402 (from FIG. 4, as used by the supply detector circuitry 200 of FIG. 2) is taking any intermediate voltage, the outputs signals (NETP, NETN) of the power mux circuitry 202 will also be floating. As a result, when operating in the normal (non-failsafe) mode, the outputs of stage 1 206, stage 2 208 and stage 3 210 are undesirable and can over-stress certain components. For example, when the signals (NETP, NETN) interact with the signal (VDDIO) over-stress violations of certain components can occur and reliability concerns are present because floating net signals (NETP, NETN) cause other circuitry to go into undesirable states.

An example of over-stress of components of FIG. 2 are discussed here. When the supply detector circuitry 200 is operating in normal (non-failsafe) mode, the supply detector circuitry 200 can be said to "have a supply available" (when in the failsafe mode the supply detector circuitry 200 can be said to "not have supply available"). The term "supply" refers to the signal (VDDIO). Therefore, when operating in the normal mode, the "supply is available" and the supply signal (VDDIO) can have a value of 1.65V. In this example, the PAD value can be 1.2V (intermediate voltage at PAD) due to Isink, as discussed above. Further, signal (VREFP) can equal signal (VREFN), which is 0.5*VDDIO (VREFP=VREFN=0.5*VDDIO). Signal (PADBY2) from the R-ladder 204 can equal 0.5*PAD, which is 0.6V. PMOS and NMOS transistors can have a maximum stress limit of 0.91V as the gate-to-source voltage (VGS) and the gate-to-drain voltage (VGD). When using the values above, VREFN=VREFP=0.825V, PAD=1.2V and PADBY2=NETP=NETN=0.6V (floating), the VGS of PMOS transistor (P1) and the VGD of PMOS transistor (P2) is calculated as VDDIO−NETP=1.65−0.6, which is 1V. This VGS and VGD voltage of 1V of PMOS transistors (P1, P2) is more than their maximum stress limit of 0.91V. Therefore, PMOS transistors (P1, P2) are operating outside of their desired range and are over-stressed, resulting in over-stress violations of the circuitry and cause reliability issues.

Similarly, the VGD of NMOS transistor (N1) and the VGS of NMOS transistor (N4) are calculated as VDDIO−NETN=1.65−0.6, which is 1V. This VGD and VGS of 1V of NMOS transistors (N1, N4) is more than their maximum stress limit of 0.91V. Therefore, NMOS transistors (N1, N4) are operating outside of their desired range and are over-stressed, resulting in over-stress violations of the circuitry and cause reliability issues.

The body connections of PMOS transistors (P1, P2, P3, P4, P5, P6, P7, P8, P9, P10, P12) can be connected to signal (BULK_FS), which is VDDIO when supply available and becomes PAD when supply is not available, and the body connections of NMOS transistors (N1, N2, N3, N4, N5, N6, N7, N8, N9, N10) can be connected to ground.

FIG. 3 illustrates signal generation circuitry 300 that provides signals to the failsafe IO circuitry (the supply detector circuitry 200) of FIG. 2.

Various signals are generated using combinations of PMOS and NMOS transistors. Thes various signals can be used by the failsafe IO circuitry to provide signals to the failsafe circuitry. These signal generation techniques will be known to a person of ordinary skill in the art and are merely examples.

For example, signal (PG_FS_S) can be generated by a PMOS transistor receiving signal (VREF_DET) at the gate and signal (PADBY2) at the source and an NMOS transistor receiving signal (VDDIO_DET) at the gate and signal (VREFP) at the source. Signal (PADFS) can be generated by a PMOS transistor receiving signal (VDDIO_DET) at the gate and signal (SIG1) at the source and a PMOS transistor receiving signal (SIG1) at the gate and signal (VDDIO) at the drain. Further, signal (SIG2) can be generated by a PMOS transistor receiving signal (PAD) at the gate and signal (SIG1) at the source and a PMOS transistor receiving signal (SIG1) at the gate and signal (PAD) at the drain. Signal (PG_FS_P) can be generated by a PMOS transistor receiving signal (SIG2) at the gate and signal (PADFS) at the source and an NMOS transistor receiving signal (VDDIO-_DET) at the gate and signal (VREFP) at the source. Also, signal (VREFN_FS) can be generated by a PMOS transistor receiving signal (VREFN) at the gate and signal (PADBY2) at the source and an NMOS transistor receiving signal (VDDIO_DET) at the gate and signal (VREFN) at the source.

FIG. 4 illustrates driver circuitry 400 that provides a pad signal (PAD) 402 to the failsafe IO circuitry of FIG. 2.

The driver circuitry 400 includes a string of PMOS transistors (P1, P2, P3) controlled (at their respective gates) by signals (PD, PG_FS_S, PG_FS_P) and a string of NMOS transistors (N1, N2) controlled (at their respective gates) by signals (VREFN_FS, ND). The pad signal (PAD) 402 is provided at a node 404 located between the PMOS transistors (P1, P2, P3) and the NMOS transistors (N1, N2). The operation of the driver circuitry 400 is discussed above and is similar to the string of transistors discussed above with respect to FIG. 1.

In addition to the over-stress problem discussed above with respect to FIG. 2, the PMOS transistor (P1) of FIG. 4 can also experience an over-stress problem. Specifically, when "supply is available" such that the failsafe IO circuitry including the driver circuitry 400 is operating in the normal mode, signal (PD) equals signal VDDIO, signal (ND) equals 0V, signal NET1 is floating, and the PAD 402 is floating. This will cause a VGD violation of PMOS transistor (P1), because the gate voltage is 1.65V and the drain voltage is around 0V (but floating). This VGS of approximately 1.65V of PMOS transistor (P1) is more than the max tolerant limit of 0.91V, as discussed above with respect to the PMOS and NMOS transistors (P1, P2, N1, N4) of FIG. 2.

Figure 5:
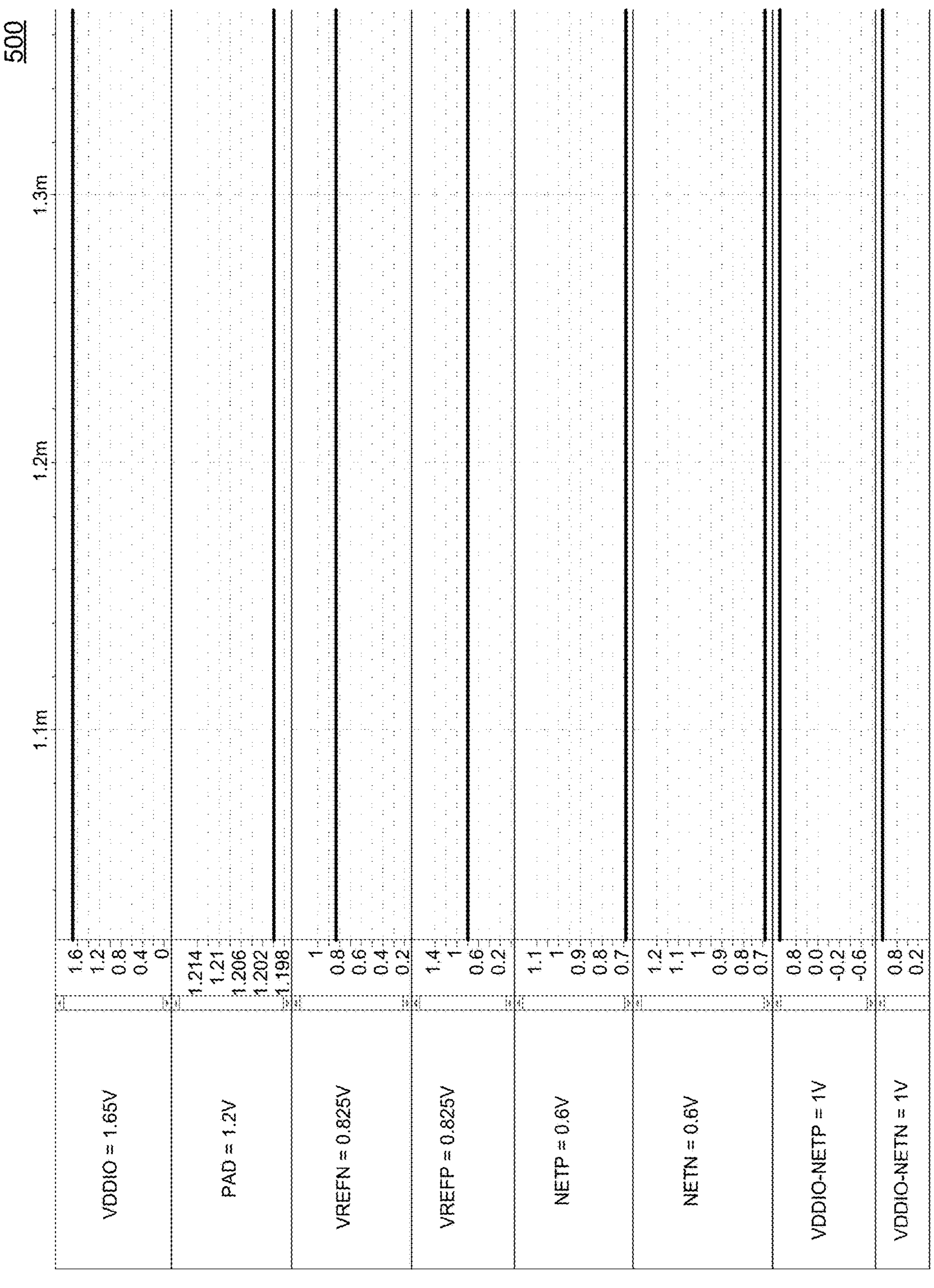
FIG. 5 illustrates a waveform chart of various signals of the failsafe IO circuitry of FIGS. 2-4.

FIG. 5 illustrates a waveform chart of various signals of the failsafe IO circuitry of FIGS. 2-4.

Specifically, FIG. 5 illustrates the values of signal (VDDIO) being 1.65V, pad signal (PAD) being 1.2V, signals (VREFN, VREFP) being 0.825V and signals (NETP, NETN) being 0.6V. The y-axis for each signal represents voltage (V) and the x-axis for each signal represents time in milliseconds, such that, for example, "1.1 m" represents 1.1 milliseconds, etc. These values result in the VGS of PMOS transistor (P1) and the VGD of PMOS transistor (P2) equaling VDDIO-NETP, which is approximately 1V and which is higher than the maximum device stress limit of 0.91V. Similarly, these values result in the VGS of NMOS transistor (N1) and the VGD of NMOS transistor (N4) equaling VDDIO-NETN, which is approximately 1V and which is higher than the maximum device stress limit of 0.91V.

Therefore, a need arises for failsafe IO circuitry that is capable of controlling the PAD signal that drives the failsafe circuitry when the failsafe IO circuitry is in normal (non-failsafe) mode and that does not over-stress the components within the failsafe IO circuitry, as described above with respect to FIGS. 2-5.

Figure 6:
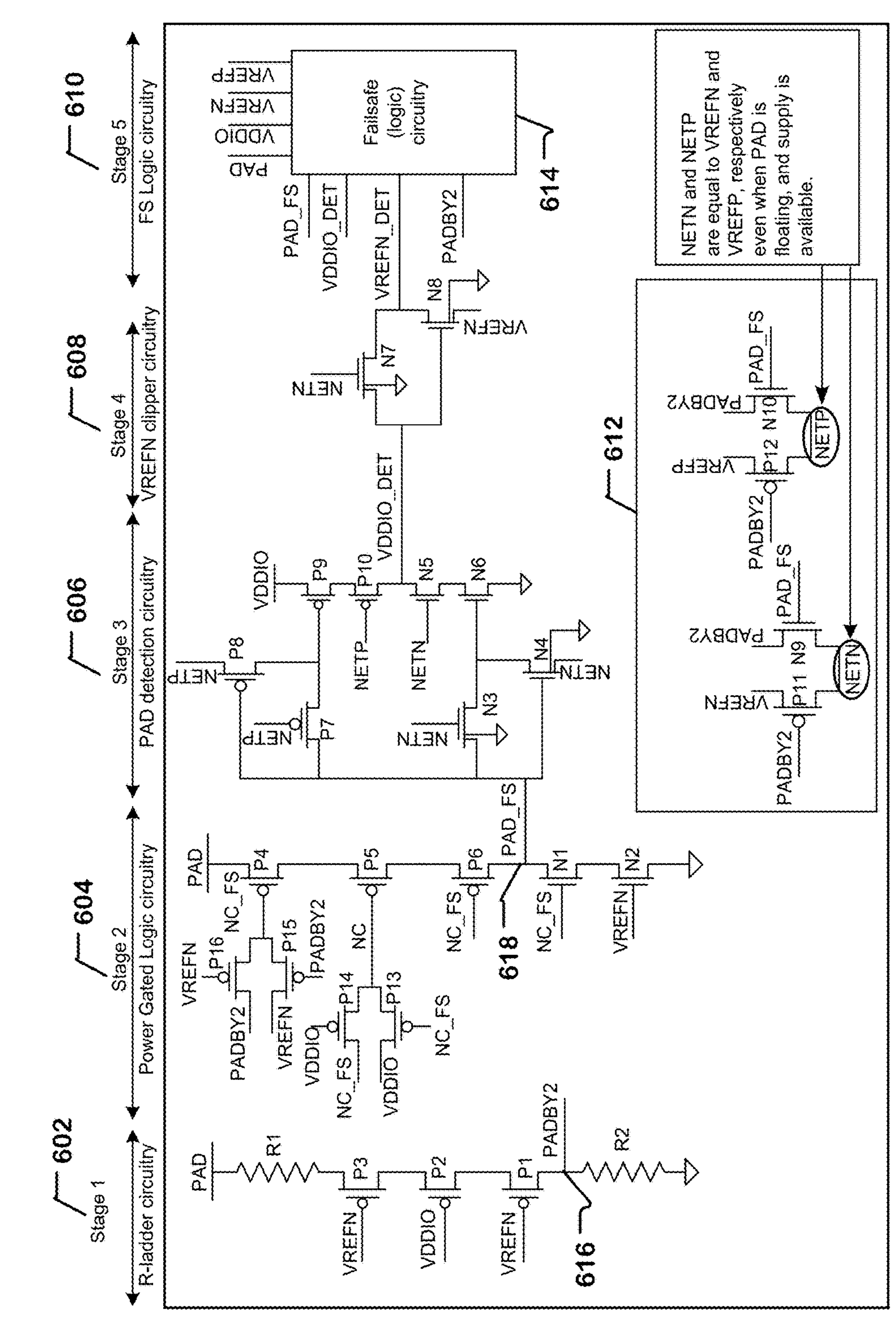
FIG. 6 illustrates circuitry that supplies signals to failsafe logic circuitry, as well as the failsafe logic circuitry itself, according to an embodiment of the present disclosure.

FIG. 6 illustrates circuitry 600 includes failsafe IO circuitry, as well as the failsafe (logic) circuitry itself, according to an embodiment of the present disclosure.

Circuitry 600 includes stage 1 602, which is R-ladder circuitry, stage 2 604, which is power gated logic circuitry, stage 3 606 which is PAD detection circuitry, stage 4 608, which is VREFN clipper circuitry and stage 5 610, which includes the failsafe (FS) (logic) circuitry. The circuitry 600 also includes power mux circuitry 612 that generates signals (NETN, NETP). Stage 3 606 and stage 4 608 are similar to that which was described with reference to FIG. 2 and can be replaced with other circuitry that provides the same functionality. Stage 5 includes the failsafe (logic) circuitry 614 that is driven by the signals provided by stages 1-4 (602, 604, 606, 608). Failsafe (logic) circuitry 614 can be used for many applications and can cause a device to operation in a certain mode based on certain circumstances. For example, one application of failsafe (logic) circuitry 614 can be reducing power consumption. For example, a failsafe circuit can be used to put other electrical components into a standby mode or, in other words, provide protection to other circuits so that they do not receive signals (or signals that are too high or that are too low) when they are not supposed to be receiving electrical signals or when they are only supposed to receive electrical signals within a certain range. The circuit architecture of stage 1 602 and stage 2 604, as well as the circuit architecture of the power mux circuitry 612 solve the problems described above with reference to FIGS. 1 and 2.

The architecture of stage 1 602 and stage 2 604 will first be described and then the operation thereof will be described for both the normal mode of operation and the failsafe mode of operation.

The R-ladder circuitry of stage 1 602 includes a resistor (R1) connected to a pad signal (PAD). The resistor (R1) is in series with a string of PMOS transistors (P1, P2, P3), which is in series with resistor (R2), which is connected to ground. A node 616 is provided between PMOS transistor (P1) and resistor (R2). The node 616 provides (output) signal (PADBY2). PMOS transistor (P1) is controlled by signal (VREFN), PMOS transistor (P2) is controlled by signal (VDDIO) and PMOS transistor (P3) is controlled by signal (VREFN). Resistors (R1, R2) can have the same or similar resistance values or they can have different values. As an example, resistor (R1) can have a value of 100K ohms and resistor (R2) can have a value of 100K ohms. The values of resistor (R1) and resistor (R2) can also be adjusted to meet the needs of a particular implementation. Output signal (PADBY2) is therefore generated in dependence upon received control signals (VDDIO, VREFN) and the pad signal (PAD).

The power gated logic circuitry of stage 2 604 includes a string of PMOS transistors (P4, P5, P6) connected in series with a string of NMOS transistors (N1, N2). A node 618 is located between the drain of PMOS transistor (P6) and the drain of NMOS transistor (N1). Node 618 provides signal (PAD_FS). The source of PMOS transistor (P4) is connected to pad signal (PAD) and the source of NMOS transistor (N2) is connected to ground. NMOS transistor (N1) is controlled (at the gate) by signal (NC_FS) and NMOS transistor (N2) is controlled (at the gate) by signal (VREFN). Signal (NC_FS) can also be referred to as a control signal (NC_FS). Control signal (NC_FS) can be obtained independent on the control signal (VREFN).

PMOS transistor (P4) is controlled (at the gate) by signal (NC_FS). PMOS transistor (P5) is controlled (at the gate) by (control) signal (NC). Signal (NC) can be obtained in dependence on the control signal (NC_FS) and the control signal (VDDIO). PMOS transistor (P6) is controlled (at the gate) by signal (NC_FS). Signal (NC_FS) is generated in dependence on PMOS transistors (P15, P16). PMOS transistor (P15) is controlled (at the gate) by signal (PADBY2) and receives signal (VREFN) at the source. PMOS transistor (P16) is controlled (at the gate) by signal (VREFN) and receives signal (PADBY2) at the source. Therefore, during operation signal (NC_FS) has a value similar to that of signal (PADBY2) or signal (VREFN).

Signal (NC) is generated in dependence on PMOS transistors (P13, P14). PMOS transistor (P13) is controlled (at the gate) by signal (NC_FS) and receives signal (VDDIO) at the source. PMOS transistor (P14) is controlled (at the gate) by signal (VDDIO) and receives signal (NC_FS) at the source. Therefore, during operation signal (NC) has a value similar to that of signal (NC_FS) or signal (VDDIO).

Normal Mode of Operation. During the normal mode of operation (when "supply is available") VDDIO has a value that is greater than zero. In this example, signal (VDDIO) can have a value of 1.65V. When signal (VDDIO) has a value of 1.65V, both signals (VREFN, VREFP) have a value of 0.825V (which is ½ of the value of VDDIO). When signals (VDDIO, VREFN) are greater than 0V, PMOS transistors (P1, P2, P3) are turned off preventing the flow of current, such that at node 616 the value of signal (PADBY2) is 0V (grounded).

With respect to stage 2 604, during the normal mode of operation, when signal (PADBY2) provided from the R-ladder circuitry is 0V and signal (VREFN) is 0.825V, the following occurs. PMOS transistor (P16) is turned off by signal (VREFN) being positive and PMOS transistor (P15) is turned on by signal (PADBY2) being 0V, thus allowing signal (VREFN) of 0.825V to pass through PMOS transistor (P15), such that signal (NC_FS)=signal (VREFN)=0.825V. PMOS transistors (P4, P6) are thus turned off by signal (NC_FS) having a positive value.

Further, PMOS transistor (P14) is turned off by signal (VDDIO) being positive such that signal (NC_FS) does not pass therethrough and PMOS transistor (P13) is turned on by the VSG=0.825V (VDDIO (1.65V)−NC_FS (0.825V)). Therefore, PMOS transistor (P13) allows signal (VDDIO) to pass therethrough, such that the value of signal (NC) is 0.825V. As a result, PMOS transistor (P5) is turned off by signal (NC) having a positive value. Accordingly, each of PMOS transistors (P4, P5, P6) are turned off in the normal mode of operation.

Additionally, NMOS transistor (N1) is turned on by signal (NC_FS) having a positive value and NMOS transistor (N2) is also turned on by signal (VREFN) having a positive value. Accordingly, during this normal mode of operation signal (PAD_FS) at node 618 is essentially connected to ground and remains at 0V. The VGS and VDS of PMOS transistors (P13, P14) is 0.825V, which is less than the maximum tolerant limit of, for example, 0.91V. Therefore, this prevents any current leakage through to node 618. As a result, signal (PAD_FS) is not influenced by current leakage when the pad signal (PAD) is floating. Similar to that described above with reference to the other figures, signal (PAD_FS) drives PAD detection circuitry, which provides signal (VDDIO_DET) to VREFN clipper circuitry, which provides signal (VREFN_DET) to the failsafe (logic) circuitry 614. The failsafe (logic) circuitry 614 also operates according to signals (PAD, VDDIO, VREFN, VREFP, PAD_FS, VDDIO_DET, PADBY2).

Furthermore, during the normal mode of operation, the power mux circuitry 612 operates as follows. PMOS transistor (P11) is turned on by signal (PADBY2) being 0V and NMOS transistor (N9) is turned off by signal (PAD_FS) being 0V, thus causing signal (NETN) to equal signal (VREFN), even when the pad signal (PAD) is floating and can be influenced by current leakage. PMOS transistor (P12) is turned on by signal (PADBY2) being 0V and NMOS transistor (N9) is turned off by signal (PAD_FS) being 0V, thus causing signal (NETP) to equal signal (VREFP), even when the pad signal (PAD) is floating and can be influenced by current leakage.

This architecture illustrated and described with reference to FIG. 6 (and the driver circuitry of FIG. 4) provides circuitry that eliminates the problems cause by current leakage on the floating PAD and solves the problem of device over-stress, even during supply ramp up and ramp down (ramp up and ramp down of VDDIO supply) and further generates failsafe control signals that avoid stress on devices and high current from PAD to VDDIO. This architecture further allows a supply detection point (e.g., threshold or trip point) to be altered/adjusted depending on the component specifications, calibrations and tolerances of the devices. This improves the performance and lengthens the life cycle of the failsafe IO circuitry as well as the failsafe circuitry and further can eliminate the need for additional voltages or reference currents.

Note that throughout this document, whenever signals are identified as being equal to each other, such that as they pass through a transistor, the signals may not be exactly equal. These are just approximations and can be dependent upon any additional resistances or impacts made by the transistors and/or other electrical components.

Failsafe Mode of Operation. During the failsafe mode of operation (when "supply is not available") VDDIO has a value of 0V (or less). When signal (VDDIO) has a value of 0V, both signals (VREFN, VREFP) have a value of 0V. When signals (VDDIO, VREFN) are 0V (or less), PMOS transistors (P1, P2, P3) are turned on allowing the flow of current, such that at node 616 the value of signal (PADBY2) is generated in dependence on the value of the pad signal (PAD). For example, pad signal (PAD) can have a value of 1.65V and signal (PADBY2) can have a value of 0.825V, while VDDIO, VREFN and VREFP=0V With respect to stage 2 604, during the failsafe mode of operation, when signal (PADBY2) provided from the R-ladder circuitry is a positive voltage (e.g., 0.825V) and signal (VREFN) is 0V, the following occurs. PMOS transistor (P15) is turned off by signal (PADBY2) having a positive value, thus preventing signal (VREFN) from passing therethrough, and PMOS transistor (P16) is turned on by signal (VREFN) being 0V and, thus allowing signal (PADBY2) (e.g., 0.825V) to pass through PMOS transistor (P16), such that signal (NC_FS)=signal (PADBY2) which is positive (e.g., 0.825V). As a result, PMOS transistor (P4) is turned on by the VSG=0.825V (PAD (1.65V)–NC_FS (0.825V)). Therefore, pad signal (PAD) is propagated through PMOS transistor (P4).

Further, PMOS transistor (P13) is turned off by signal (NC_FS) being positive (e.g., 0.825V) and signal (VDDIO) being 0V. PMOS transistor (P14) is turned on by signal (VDDIO) being 0V, such that signal (NC_FS) (e.g., 0.825V) passes therethrough and signal (NC)=signal (NC_FS), which is 0.825V. As a result, PMOS transistor (P5) is turned on by the VSG=0.825V (PAD (1.65V)–NC (0.825V)). Therefore, the pad signal (PAD) is propagated through PMOS transistor (P5).

PMOS transistor (P6) is also controlled by signal (NC_FS) which has a value of 0.825V, such that PMOS transistor (P6) is turned on by the VSG=0.825V (PAD (1.65V)–NC_FS (0.825V)). Therefore, the pad signal (PAD) is propagated through PMOS transistor (P6) to node 618, such that the signal (PAD_FS) follows (is provided in dependence on) pad signal (PAD).

Additionally, NMOS transistor (N1) can be turned on by signal (NC_FS) having a positive value and NMOS transistor (N2) is turned off by signal (VREFN) having a negative value. Similar to that described above with reference to the other figures, signal (PAD_FS) drives PAD detection circuitry, which provides signal (VDDIO_DET) to VREFN clipper circuitry, which provides signal (VREFN_DET) to the failsafe (logic) circuitry 614. The failsafe (logic) circuitry 614 also operates according to signals (PAD, VDDIO, VREFN, VREFP, PAD_FS, VDDIO_DET, PADBY2).

Furthermore, during the failsafe mode of operation, the power mux circuitry 612 operates as follows. PMOS transistor (P11) is turned off by signal (PADBY2) having a positive voltage (e.g., 0.825V) and NMOS transistor (N9) is turned on by signal (PAD_FS) having a positive voltage, thus causing signal (NETN) to equal signal (PADBY2). PMOS transistor (P12) is turned off by signal (PADBY2) having a positive voltage and NMOS transistor (N9) is turned on by signal (PAD_FS) having a positive voltage, thus causing signal (NETP) to equal signal (PADBY2).

FIG. 7 is a chart that illustrates values of various signals using the circuitry of FIG. 2 and FIG. 6.

As illustrated, the chart of FIG. 7 includes four columns, the first column includes various signals, the second column includes the values of the signals for the circuitry of FIG. 2, when in the normal mode of operation ("supply is available"), the third column includes the values of the signals for the circuitry of FIG. 6, when in the normal mode of operation ("supply is available") and the fourth column includes the values of the signal for the circuitry of FIG. 6 when in the failsafe mode of operation ("supply is not available").

The signals include (VREFN, VRENP, PADBY2, NC_FS, NC, NETP, NETN, PAD_FS, VDDIO_DET, VREFN_DET, PG_FS_S, PG_FS_P, and VREFN_FS).

As illustrated in the second column, when in the normal mode of operation, the values of the signals in the circuitry of FIG. 2 are mostly floating. For example, signals PADBY2, NETP, NETN, PAD_FS, VDDIO_DET, VREFN_DET, PG_FS_S, PG_FS_P, and VREFN_FS have floating values that will vary with the floating value of the pad signal (PAD). Signals NC_FS and NC are not present in the circuitry of FIG. 2 and the signals VREFN and VREFP have values of 0.5*VDDIO.

Further, as illustrated in the third column, in the normal mode of operation ("supply is available"), the circuitry of FIG. 6 provides signals as follows: (i) VREFN=0.5*VDDIO, (ii) VREFP=0.5*VDDIO, (iii) PADBY2=0V, (iv) NC_FS=VREFN, (v) NC=VDDIO, (vi) NETP=VREFP, (vii) NETN=VREFN, (viii) PAD_FS=0V, (ix) VDDIO_DET=VDDIO, (x) VREFN_DET=VREFN, (xi) PG_FS_S=VREFP, (xii) PG_FS_P=VREFP, and (xiii) VREFN_FS=VREFN.

Additionally, as illustrated in the fourth column, in the failsafe mode of operation ("supply is available"), the circuitry of FIG. 6 provides signals as follows: (i) VREFN=0V, (ii) VREFP=0V, (iii) PADBY2=0.5*PAD, (iv) NC_FS=0.5*PAD, (v) NC=0.5*PAD, (vi) NETP=0.5*PAD, (vii) NETN=0.5*PAD, (viii) PAD_FS=PAD, (ix) VDDIO_DET=0V, (x) VREFN_DET=0V, (xi) PG_FS_S=0.5*PAD, (xii) PG_FS_P=PAD, and (xiii) VREFN_FS=0.5*PAD.

Figure 8:
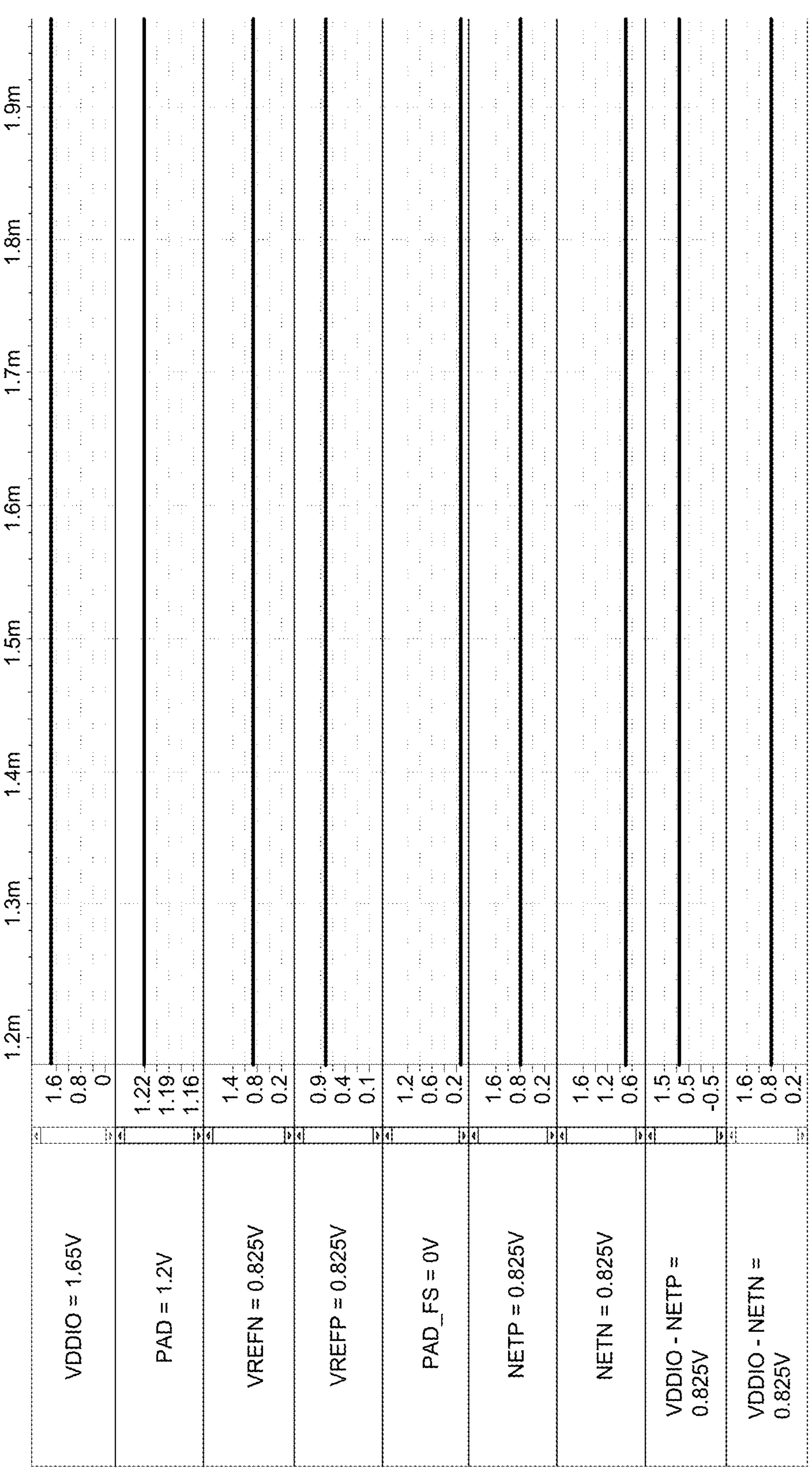
FIG. 8 illustrates a waveform chart of various signals of the failsafe IO circuitry of FIG. 6.

FIG. 8 illustrates a waveform chart of various signals of the failsafe IO circuitry of FIG. 6 when in the normal mode of operation.

Specifically, FIG. 8 illustrates the values of signal (VDDIO) being 1.65V, pad signal (PAD) being 1.2V, signals (VREFN, VREFP) being 0.825V, signal (PAD_FS) being 0V, and signals (NETP, NETN) being 0.825V. These values result in VDDIO−NETP and VDDIO−NETN being 0.825V, which does not create an over-stress situation in transistor components, and NETN & NETP will follow VREFN & VREFP respectively through power mux circuit. The y-axis for each signal represents voltage (V) and the x-axis for each signal represents time in milliseconds, such that, for example, "1.2 m" represents 1.2 milliseconds, etc.

Figure 9:
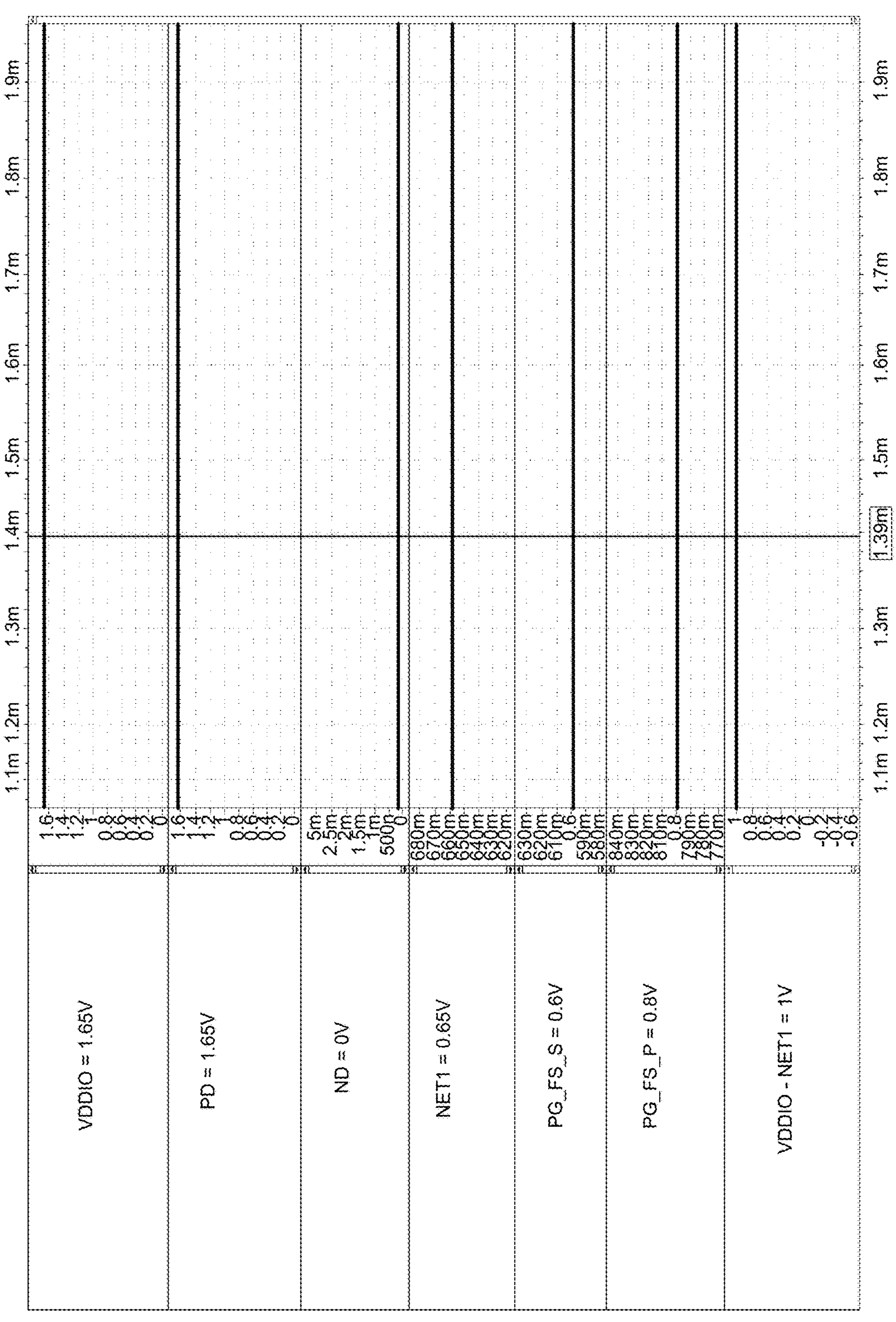
FIG. 9 illustrates another waveform chart of various signals of the failsafe IO circuitry of FIG. 2.

FIG. 9 illustrates a waveform chart of various signals of the failsafe IO circuitry of FIGS. 2-3, when in the normal mode of operation, wherein components of the driver circuitry 400 over over-stressed.

Specifically, FIG. 9 illustrates the values of signal (VDDIO) being 1.65V, signal (PD) being 1.65V, signal (ND) being 0V, signal (NET1) being 0.65V, signal (PG_FS_S) being 0.6V, and signal (PG_FS_P) being 0.8V. These values result in VDDIO-NET1 being 1V, which is over 0.91V and creates an over-stress situation in PMOS transistor (P1) of driver circuitry 400. The y-axis for each signal represents voltage (V) and the x-axis for each signal represents time in milliseconds, such that, for example, "1.1 m" represents 1.1 milliseconds, etc.

Figure 10:
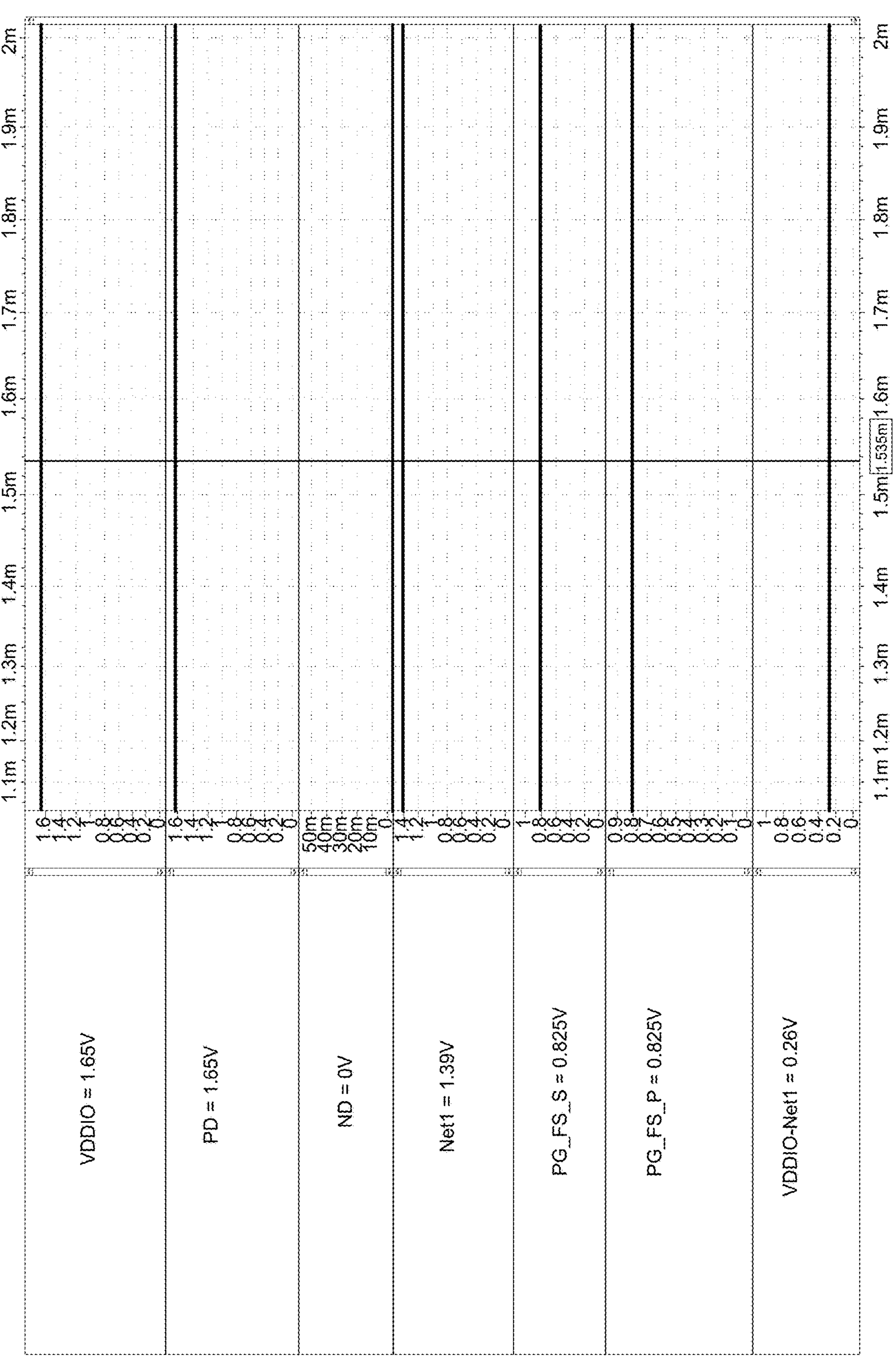
FIG. 10 illustrates another waveform chart of various signals of the failsafe IO circuitry of FIG. 6.

FIG. 10 illustrates a waveform chart of various signals of the failsafe IO circuitry of FIG. 6, when in the normal mode of operation, wherein components of the driver circuitry 400 are not over-stressed.

Specifically, FIG. 10 illustrates the values of signal (VDDIO) being 1.65V, signal (PD) being 1.65V, signal (ND) being 0V, signal (NET1) being 1.39V, signal (PG_FS_S) being 0.825V, and signal (PG_FS_P) being 0.825V. These values result in VDDIO-NET1 being 0.26V, which is below 0.91V and does not create an over-stress situation in PMOS transistor (P1) of driver circuitry 400. The y-axis for each signal represents voltage (V) and the x-axis for each signal represents time in milliseconds, such that, for example, "1.1 m" represents 1.1 milliseconds, etc.

Figure 11:
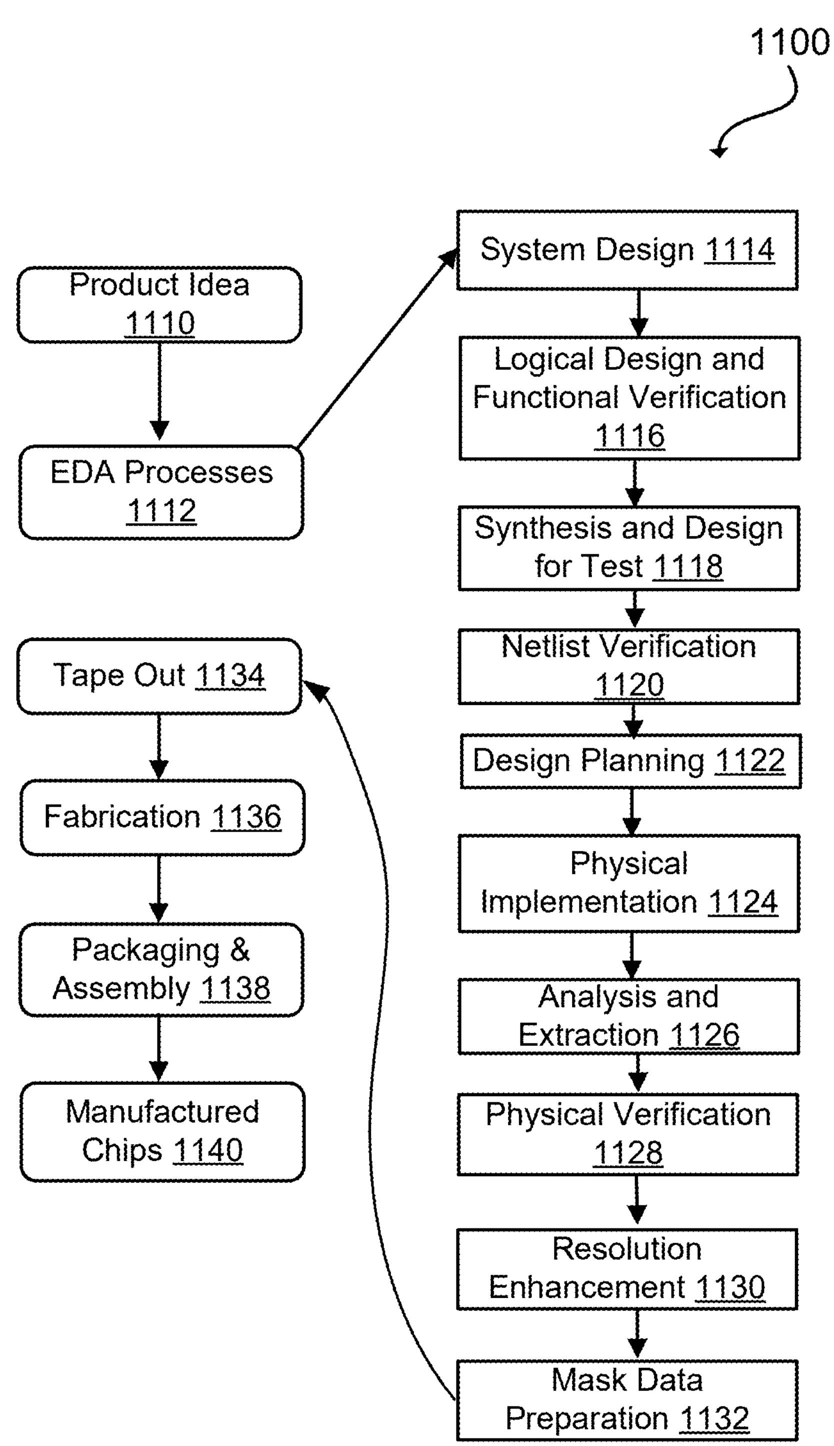
FIG. 11 depicts a flowchart of various processes used during the design and manufacture of an integrated circuit in accordance with some embodiments of the present disclosure.

FIG. 11 depicts a flowchart of various processes used during the design and manufacture of an integrated circuit in accordance with some embodiments of the present disclosure.

FIG. 11 illustrates an example set of processes 1100 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1110 with information supplied by a designer, information which is transformed to create an article of manufacture that uses a set of EDA processes 1112. When the design is finalized, the design is taped-out 1134, which is when artwork (e.g., geometric patterns) for the integrated circuit is sent to a fabrication facility to manufacture the mask set, which is then used to manufacture the integrated circuit. After tape-out, a semiconductor die is fabricated 1136 and packaging and assembly processes 1138 are performed to produce the finished integrated circuit 1140.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 11. The processes described may be enabled by EDA products (or EDA systems).

During system design 1114, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1116, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1118, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1120, the netlist is checked for compliance with timing constraints and for correspondence with the HDL code. During design planning 1122, an overall floor plan for the integrated circuit is constructed and analyzed for timing and top-level routing.

During layout or physical implementation 1124, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provide a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1126, the circuit function is verified at the layout level, which permits refinement of the layout design. During physical verification 1128, the layout design is checked to ensure that manufacturing constraints are correct, such as DRC constraints, electrical constraints, lithographic constraints, and that circuitry function matches the HDL design specification. During resolution enhancement 1130, the geometry of the layout is transformed to improve how the circuit design is manufactured.

During tape-out, data is created to be used (after lithographic enhancements are applied if appropriate) for production of lithography masks. During mask data preparation 1132, the 'tape-out' data is used to produce lithography masks that are used to produce finished integrated circuits.

A storage subsystem of a computer system (such as computer system 1200 of FIG. 12) may be used to store the programs and data structures that are used by some or all of the EDA products described herein, and products used for development of cells for the library and for physical and logical design that use the library.

Figure 12:
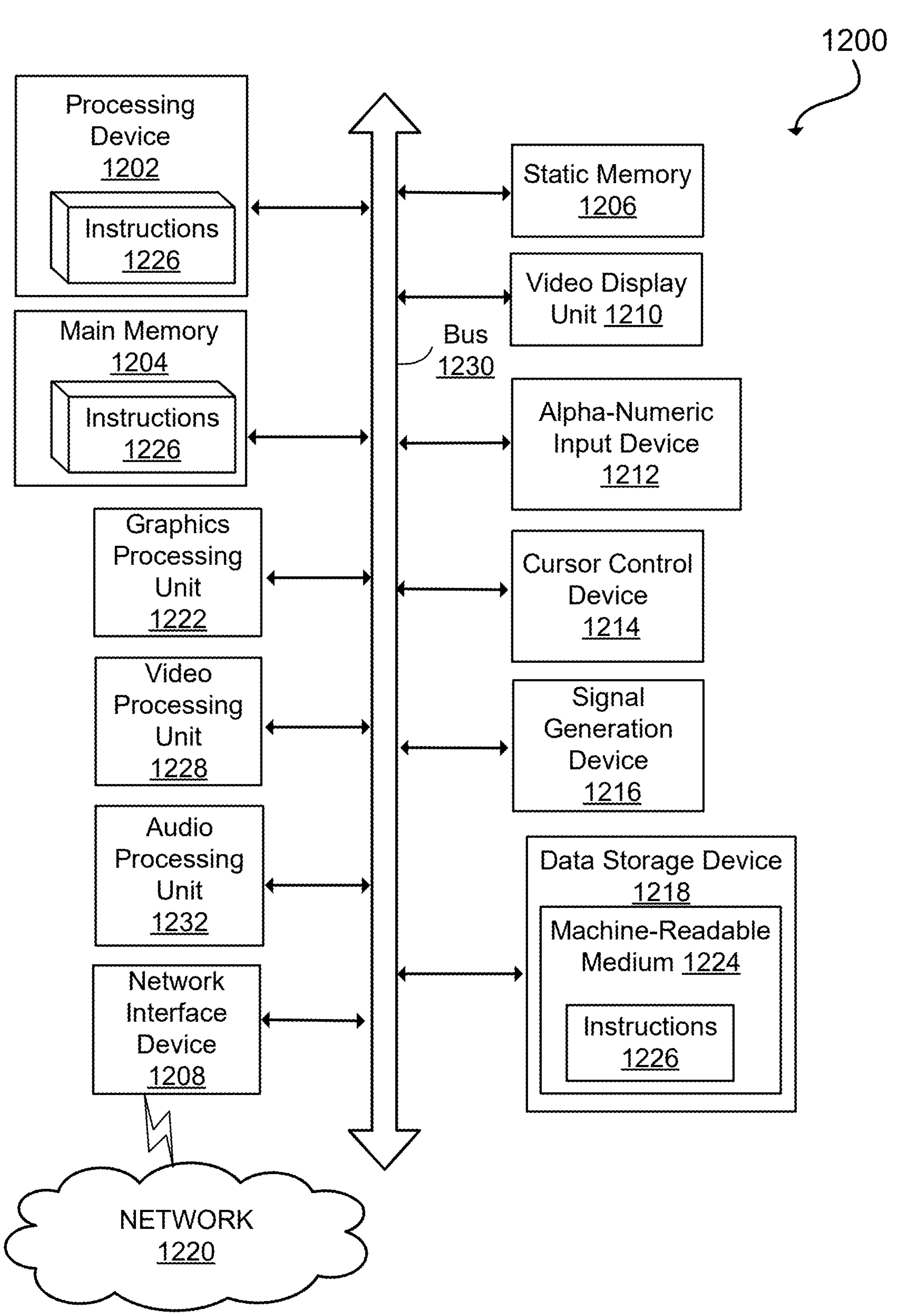
FIG. 12 depicts a diagram of an example computer system in which embodiments of the present disclosure may operate.

FIG. 12 illustrates an example machine of a computer system 1200 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in a client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM), a static memory 1206 (e.g., flash memory, static random access memory (SRAM), etc.), and a data storage device 1218, which communicate with each other via a bus 1230.

Processing device 1202 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 may also be one or more special-purpose processing devices such as an application specific integrated circuit (ASIC), a field programmable gate array (FPGA), a digital signal processor (DSP), network processor, or the like. The processing device 1202 may be configured to execute instructions 1226 for performing the operations and steps described herein.

The computer system 1200 may further include a network interface device 1208 to communicate over the network 1220. The computer system 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse), a graphics processing unit 1222, a signal generation device 1216 (e.g., a speaker), graphics processing unit 1222, video processing unit 1228, and audio processing unit 1232.

The data storage device 1218 may include a machine-readable storage medium 1224 (also known as a non-transitory computer-readable medium) on which is stored one or more sets of instructions 1226 or software embodying any one or more of the methodologies or functions described herein. The instructions 1226 may also reside, completely or at least partially, within the main memory 1204 and/or within the processing device 1202 during execution thereof by the computer system 1200, the main memory 1204 and the processing device 1202 also constituting machine-readable storage media.

In some implementations, the instructions 1226 include instructions to implement functionality corresponding to the present disclosure. While the machine-readable storage medium 1224 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1202 to perform any one or more of the methodologies of the present disclosure. The term "machine-readable storage medium" shall accordingly be taken to include, but not be limited to, solid-state memories, optical media, and magnetic media.

In an embodiment, failsafe IO circuitry for supplying signals to failsafe logic circuitry is provided. The failsafe IO circuitry can operate in a failsafe mode and a normal mode. The failsafe IO circuitry can include input circuitry that (i) receives a pad signal (PAD) from driver circuitry, (ii) receives control signals (VDDIO, VREFN) and (iii) provides an output signal (PADBY2) generated based on the received control signals (VDDIO, VREFN), wherein, when operating in the normal mode, the pad signal (PAD) is a floating signal and the output signal (PADBY2) is 0 volts (0V), and power gated logic circuitry that (i) receives the output signal (PADBY2) from the input circuitry, (ii) receives the control signals (VDDIO, VREFN) and (iii)

outputs a reference pad failsafe signal (PAD_FS), wherein, when operating in the normal mode, the reference pad failsafe signal (PAD_FS) is 0V.

In a further embodiment, when operating in the failsafe mode, the control signal (VDDIO) is not available or is 0V, the pad signal (PAD) can have a positive voltage, the output signal (PADBY2) can have a positive voltage driven by the pad signal (PAD) and the reference pad failsafe signal (PAD_FS) can have a positive voltage driven by the pad signal (PAD) and controlled by the output signal (PADBY2).

In another embodiment, the input circuitry can include two or more transistors that are in series and that are controlled by the control signals (VDDIO, VREFN), wherein one transistor of the two or more transistors receives the pad signal (PAD) as an input, wherein another transistor of the two or more transistors is grounded at an output, with the output signal (PADBY2) being connected to the output of the other transistor, and wherein, when operating in the normal mode, the control signals (VDDIO, VREFN) turn off the transistors, such that the output signal (PADBY2) is 0V.

In an embodiment, when operating in the failsafe mode, the control signals (VDDIO, VREFN) can turn on the two or more transistors, such that the output signal (PADBY2) is a positive voltage driven by the pad signal (PAD).

In another embodiment, the two or more transistors can include a first PMOS transistor (P1) connected in series with a second PMOS transistor (P2) and a third PMOS transistor (P3) connected in series with the second PMOS transistor (P2), wherein the first and third PMOS transistors (P1, P3) are controlled by the control signal (VREFN) and the second PMOS transistor (P2) is controlled by the control signal (VDDIO), and wherein a source of the third PMOS transistor (P3) receives the pad signal (PAD) and a drain of the first PMOS transistor (P1) is connected to ground and a node that provides the output signal (PADBY2).

In a further embodiment, when operating in the normal mode, the control signals (VDDIO, VREFN) can have a positive voltage, such that the first, second and third PMOS transistors (P1, P2, P3) are turned off and the output signal (PADBY2) is grounded at 0V, and wherein, when operating in the failsafe mode, the control signals (VDDIO, VREFN) are 0V or have a negative voltage, such that the first, second and third PMOS transistors (P1, P2, P3) are turned on and the output signal (PADBY2) is a positive voltage driven by the pad signal (PAD).

In an embodiment, the power gated logic circuitry can include a first string of transistors that are in series, that are controlled by the control signals (VDDIO, VREFN) and by the output signal (PADBY2) and that receive the pad signal (PAD) as an input, wherein the power gated logic circuitry includes a second string of transistors that are in series, that are controlled by control signals (NC_FS, VREFN) and that are connected to ground, and wherein, when operating in the normal mode, the control signals (VDDIO, VREFN) and the output signal (PADBY2) turn off the first string of transistors and the control signals (NC_FS, VREFN) turn on the second string of transistors, such that the reference pad failsafe signal (PAD_FS) is grounded.

In a further embodiment, when operating in the failsafe mode the control signals (VDDIO, VREFN) and the output signal (PADBY2) can turn on the first string of transistors and the control signals (NC_FS, VREFN) turn off the second string of transistors, such that the reference pad failsafe signal (PAD_FS) has a positive voltage driven by the pad signal (PAD).

In another embodiment, the first string of transistors can includes a first PMOS transistor (P4) connected in series with a second PMOS transistor (P5) and a third PMOS transistor (P6) connected in series with the second PMOS transistor (P5), wherein the first PMOS transistor (P4) is controlled by a control signal (NC_FS) obtained based on the control signal (VREFN) and the output signal (PADBY2), the second PMOS transistor (P5) is controlled by a control signal (NC) obtained based on the control signal (VDDIO) and the control signal (NC_FS) and the third PMOS transistor (P6) is controlled by the control signal (NC_FS), and wherein a source of the first PMOS transistor (P4) receives the pad signal (PAD) and a drain of the third PMOS transistor (P4) is connected to second string of transistors to provide the reference pad failsafe signal (PAD_FS).

In an embodiment, when operating in in the normal mode, the control signals (NC_FS, NC) can have a positive voltage, such that the first, second and third PMOS transistors (P4, P5, P6) are turned off and the reference pad failsafe signal (PAD_FS) is grounded at 0V, and wherein, when operating in the failsafe mode, the control signals (NC_FS, NC) are 0V or have a negative voltage, such that the first, second and third PMOS transistors (P4, P5, P6) are turned on and the reference pad failsafe signal (PAD_FS) is a positive voltage driven by the pad signal (PAD).

In an embodiment, the second string of transistors can includes a first NMOS transistor (N1) connected in series with a second NMOS transistor (N2), wherein the first NMOS transistor (N1) is controlled by the control signal (NC_FS) and the second NMOS transistor (N2) is controlled by the control signal (VREFN), and wherein a drain of the first NMOS transistor (N1) is connected to a drain of the third PMOS transistor (P4) and to a node that provides the reference pad failsafe signal (PAD_FS) and a source of the second NMOS transistor (N2) is connected to ground.

In another embodiment, when operating in the normal mode the control signals (NC_FS, NC, VREF) can have a positive voltage, such that the first, second and third PMOS transistors (P4, P5, P6) are turned off, the first and second NMOS transistors (N1, N2) are turned on and the reference pad failsafe signal (PAD_FS) is grounded at 0V, and wherein, when in the failsafe mode, the control signals (NC_FS, NC, VREF) are 0V or have a negative voltage, such that the first, second and third PMOS transistors (P4, P5, P6) are turned on, the first and second NMOS transistors (N1, N2) are turned off and the reference pad failsafe signal (PAD_FS) is a positive voltage driven by the pad signal (PAD).

In a further embodiment, the reference pad failsafe signal (PAD_FS) can be provided to a detection circuit configured to provide a VDDIO detection signal (VDDIO_DET) generated based on NET signals (NETN, NETP) and the control signal (VDDIO).

In an embodiment, the net signal (NETN) can be generated based on the output signal (PADBY2), the control signal (VREFN) and the reference pad failsafe signal (PAD_FS), and wherein the net signal (NETP) is generated based on the output signal (PADBY2), a control signal (VREFP) and the reference pad failsafe signal (PAD_FS).

In another embodiment, the VDDIO detection signal (VDDIO_DET) can be used to generate a VREF detection signal (VREF_DET) that is provided to the failsafe logic circuitry.

In a further embodiment, the output signal (PADBY2) and the reference pad failsafe signal (PAD_FS) can be provided to the failsafe logic circuitry.

In an embodiment, a method of supplying signals to failsafe logic circuitry operating in a failsafe mode and a normal mode is provided. The method can include receiving a pad signal (PAD) from driver circuitry, receiving control signals (VDDIO, VREFN) and providing an output signal (PADBY2) generated based on the received control signals (VDDIO, VREFN), wherein, when operating in the normal mode, the pad signal (PAD) is a floating signal and the output signal (PADBY2) is 0 volts (0V). The method can further include outputting a reference pad failsafe signal (PAD_FS) generated based on the output signal (PADBY2) and the control signals (VDDIO, VREFN), wherein, when operating in the normal mode, the reference pad failsafe signal (PAD_FS) is 0V.

In an embodiment, the method can further include, when operating in the failsafe mode, the pad signal (PAD) has a positive voltage, the output signal (PADBY2) has a positive voltage driven by the pad signal (PAD) and the reference pad failsafe signal (PAD_FS) has a positive voltage driven by the pad signal (PAD) and controlled by the output signal (PADBY2).

In another embodiment, a non-transitory computer readable medium comprising stored instructions for supplying signals to failsafe logic circuitry operating in a failsafe mode and a normal mode can be provided. The instructions, when executed by a processor, can cause the processor to receive a pad signal (PAD) from driver circuitry, receive control signals (VDDIO, VREFN) and provide an output signal (PADBY2) generated based on the received control signals (VDDIO, VREFN), and output a reference pad failsafe signal (PAD_FS) generated based on the output signal (PADBY2) and the control signals (VDDIO, VREFN), wherein, when operating in the failsafe mode, the pad signal (PAD) has a positive voltage, the output signal (PADBY2) has a positive voltage driven by the pad signal (PAD) and the reference pad failsafe signal (PAD_FS) has a positive voltage driven by the pad signal (PAD) and controlled by the output signal (PADBY2).

In another embodiment, when operating in the normal mode, the pad signal (PAD) is a floating signal and the output signal (PADBY2) is 0 volts (0V) and the reference pad failsafe signal (PAD_FS) is 0V.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. Circuitry, comprising:

input circuitry that (i) receives a pad signal (PAD) from driver circuitry, (ii) receives control signals (VDDIO, VREFN) and (iii) provides an output signal (PADBY2) generated based on the received control signals (VDDIO, VREFN), wherein, when operating in a normal mode, the pad signal (PAD) is a floating signal and the output signal (PADBY2) is 0 volts (0V); and power gated logic circuitry that (i) receives the output signal (PADBY2) from the input circuitry, (ii) receives the control signals (VDDIO, VREFN) and (iii) outputs a reference pad failsafe signal (PAD_FS), wherein, when operating in the normal mode, the reference pad failsafe signal (PAD_FS) is 0V.

2. The circuitry of claim 1, wherein, when operating in a failsafe mode, the control signal (VDDIO) is not available or is 0V, the pad signal (PAD) has a positive voltage, the output signal (PADBY2) has a positive voltage driven by the pad signal (PAD) and the reference pad failsafe signal (PAD_FS) has a positive voltage driven by the pad signal (PAD) and controlled by the output signal (PADBY2).

3. The circuitry of claim 2,
wherein the input circuitry includes two or more transistors that are in series and that are controlled by the control signals (VDDIO, VREFN),
wherein one transistor of the two or more transistors receives the pad signal (PAD) as an input,
wherein another transistor of the two or more transistors is grounded at an output, with the output signal (PADBY2) being connected to the output of the other transistor, and
wherein, when operating in the normal mode, the control signals (VDDIO, VREFN) turn off the transistors, such that the output signal (PADBY2) is 0V.

4. The circuitry of claim 3, wherein, when operating in the failsafe mode, the control signals (VDDIO, VREFN) turn on the two or more transistors, such that the output signal (PADBY2) is a positive voltage driven by the pad signal (PAD).

5. The circuitry of claim 3,
wherein the two or more transistors include a first PMOS transistor (P1) connected in series with a second PMOS transistor (P2) and a third PMOS transistor (P3) connected in series with the second PMOS transistor (P2),
wherein the first and third PMOS transistors (P1, P3) are controlled by the control signal (VREFN) and the second PMOS transistor (P2) is controlled by the control signal (VDDIO), and
wherein a source of the third PMOS transistor (P3) receives the pad signal (PAD) and a drain of the first PMOS transistor (P1) is connected to ground and a node that provides the output signal (PADBY2).

6. The circuitry of claim 5,
wherein, when operating in the normal mode, the control signals (VDDIO, VREFN) have a positive voltage, such that the first, second and third PMOS transistors (P1, P2, P3) are turned off and the output signal (PADBY2) is grounded at 0V, and
wherein, when operating in the failsafe mode, the control signals (VDDIO, VREFN) are 0V or have a negative voltage, such that the first, second and third PMOS transistors (P1, P2, P3) are turned on and the output signal (PADBY2) is a positive voltage driven by the pad signal (PAD).

7. The circuitry of claim 2,
wherein the power gated logic circuitry includes a first string of transistors that are in series, that are controlled by the control signals (VDDIO, VREFN) and by the output signal (PADBY2) and that receive the pad signal (PAD) as an input,
wherein the power gated logic circuitry includes a second string of transistors that are in series, that are controlled by control signals (NC_FS, VREFN) and that are connected to ground, and
wherein, when operating in the normal mode, the control signals (VDDIO, VREFN) and the output signal (PADBY2) turn off the first string of transistors and the control signals (NC_FS, VREFN) turn on the second string of transistors, such that the reference pad failsafe signal (PAD_FS) is grounded.

8. The circuitry of claim 7, wherein, when operating in the failsafe mode, the control signals (VDDIO, VREFN) and the output signal (PADBY2) turn on the first string of transistors and the control signals (NC_FS, VREFN) turn off the second string of transistors, such that the reference pad failsafe signal (PAD_FS) has a positive voltage driven by the pad signal (PAD).

9. The circuitry of claim 7,
wherein the first string of transistors includes a first PMOS transistor (P4) connected in series with a second PMOS transistor (P5) and a third PMOS transistor (P6) connected in series with the second PMOS transistor (P5),
wherein the first PMOS transistor (P4) is controlled by a control signal (NC_FS) obtained based on the control signal (VREFN) and the output signal (PADBY2), the second PMOS transistor (P5) is controlled by a control signal (NC) obtained based on the control signal (VDDIO) and the control signal (NC_FS) and the third PMOS transistor (P6) is controlled by the control signal (NC_FS), and
wherein a source of the first PMOS transistor (P4) receives the pad signal (PAD) and a drain of the third PMOS transistor (P4) is connected to second string of transistors to provide the reference pad failsafe signal (PAD_FS).

10. The circuitry of claim 9,
wherein, when operating in in the normal mode, the control signals (NC_FS, NC) have a positive voltage, such that the first, second and third PMOS transistors (P4, P5, P6) are turned off and the reference pad failsafe signal (PAD_FS) is grounded at 0V, and
wherein, when operating in the failsafe mode, the control signals (NC_FS, NC) are 0V or have a negative voltage, such that the first, second and third PMOS transistors (P4, P5, P6) are turned on and the reference pad failsafe signal (PAD_FS) is a positive voltage driven by the pad signal (PAD).

11. The circuitry of claim 9,
wherein the second string of transistors includes a first NMOS transistor (N1) connected in series with a second NMOS transistor (N2),
wherein the first NMOS transistor (N1) is controlled by the control signal (NC_FS) and the second NMOS transistor (N2) is controlled by the control signal (VREFN), and
wherein a drain of the first NMOS transistor (N1) is connected to a drain of the third PMOS transistor (P4) and to a node that provides the reference pad failsafe signal (PAD_FS) and a source of the second NMOS transistor (N2) is connected to ground.

12. The circuitry of claim 11,
wherein, when operating in the normal mode the control signals (NC_FS, NC, VREF) have a positive voltage, such that the first, second and third PMOS transistors (P4, P5, P6) are turned off, the first and second NMOS transistors (N1, N2) are turned on and the reference pad failsafe signal (PAD_FS) is grounded at 0V, and
wherein, when in the failsafe mode, the control signals (NC_FS, NC, VREF) are 0V or have a negative voltage, such that the first, second and third PMOS transistors (P4, P5, P6) are turned on, the first and second NMOS transistors (N1, N2) are turned off and the reference pad failsafe signal (PAD_FS) is a positive voltage driven by the pad signal (PAD).

13. The circuitry of claim 1, wherein the reference pad failsafe signal (PAD_FS) is provided to a detection circuit that provides a VDDIO detection signal (VDDIO_DET) generated based on NET signals (NETN, NETP) and the control signal (VDDIO).

14. The circuitry of claim 13, wherein the net signal (NETN) is generated based on the output signal (PADBY2), the control signal (VREFN) and the reference pad failsafe signal (PAD_FS), and wherein the net signal (NETP) is generated based on the output signal (PADBY2), a control signal (VREFP) and the reference pad failsafe signal (PAD_FS).

15. The circuitry of claim 13, wherein the VDDIO detection signal (VDDIO_DET) is used to generate a VREF detection signal (VREF_DET) that is provided to the failsafe logic circuitry.

16. The circuitry of claim 13, wherein the output signal (PADBY2) and the reference pad failsafe signal (PAD_FS) are provided to the failsafe logic circuitry.

17. A method of supplying signals to failsafe logic circuitry, the method comprising:

receiving a pad signal (PAD) from driver circuitry, receiving control signals (VDDIO, VREFN) and providing an output signal (PADBY2) generated based on the received control signals (VDDIO, VREFN), wherein, when operating in a normal mode, the pad signal (PAD) is a floating signal and the output signal (PADBY2) is 0 volts (0V); and outputting a reference pad failsafe signal (PAD_FS) generated based on the output signal (PADBY2) and the control signals (VDDIO, VREFN), wherein, when operating in the normal mode, the reference pad failsafe signal (PAD_FS) is 0V.

18. The method of claim 17, wherein, when operating in a failsafe mode, the control signal (VDDIO) is not available or is 0V, the pad signal (PAD) has a positive voltage, the output signal (PADBY2) has a positive voltage driven by the pad signal (PAD) and the reference pad failsafe signal (PAD_FS) has a positive voltage driven by the pad signal (PAD) and controlled by the output signal (PADBY2).

19. A non-transitory computer readable medium comprising stored instructions for supplying signals to failsafe logic circuitry, the instructions, when executed by a processor, cause the processor to:

receive a pad signal (PAD) from driver circuitry, receive control signals (VDDIO, VREFN) and provide an output signal (PADBY2) generated based on the received control signals (VDDIO, VREFN); and output a reference pad failsafe signal (PAD_FS) generated based on the output signal (PADBY2) and the control signals (VDDIO, VREFN), wherein, when operating in a failsafe mode, the pad signal (PAD) has a positive voltage, the output signal (PADBY2) has a positive voltage driven by the pad signal (PAD) and the reference pad failsafe signal (PAD_FS) has a positive voltage driven by the pad signal (PAD) and controlled by the output signal (PADBY2).

20. The non-transitory computer readable medium of claim 19, wherein, when operating in a normal mode, the pad signal (PAD) is a floating signal and the output signal (PADBY2) is 0 volts (0V) and the reference pad failsafe signal (PAD_FS) is 0V.

* * * * *